United States Patent [19]

Salisbury et al.

[11] Patent Number: 5,548,481
[45] Date of Patent: Aug. 20, 1996

[54] ELECTRONIC MODULE CONTAINING AN INTERNALLY RIBBED, INTEGRAL HEAT SINK AND BONDED, FLEXIBLE PRINTED WIRING BOARD WITH TWO-SIDED COMPONENT POPULATION

[75] Inventors: Kenneth A. Salisbury, Livonia; Pawel Kalinowski, Birmingham; Jay D. Baker, Dearborn, all of Mich.

[73] Assignee: Ford Motor Company, Dearborn, Mich.

[21] Appl. No.: 308,875

[22] Filed: Sep. 19, 1994

Related U.S. Application Data

[63] Continuation of Ser. No. 43,099, Apr. 5, 1993, abandoned.

[51] Int. Cl.$^6$ .................................................. H05K 7/20
[52] U.S. Cl. ........................... 361/709; 174/16.3; 361/705; 361/749
[58] Field of Search .................................. 165/80.3, 185; 174/16.3, 52.2, 252; 257/712, 713, 722; 361/689, 690, 692, 702, 703–705, 707–709, 710, 713, 715, 720, 736, 752, 749, 785, 800, 816, 818, 717–719

[56] References Cited

U.S. PATENT DOCUMENTS

| | | | |
|---|---|---|---|
| 4,177,499 | 12/1979 | Voekmann | 361/388 |
| 4,326,238 | 4/1982 | Takeda | 361/386 |
| 4,396,936 | 8/1983 | McIver | 174/252 |
| 4,707,726 | 11/1987 | Tinder | 174/252 |
| 4,715,430 | 12/1987 | Arnold | 165/80.3 |
| 4,739,443 | 4/1988 | Singhdeo | 174/252 |
| 4,769,557 | 9/1988 | Houf et al. | 307/147 |
| 4,771,365 | 9/1988 | Cichocki | 361/818 |
| 4,837,664 | 6/1989 | Rodriguez, II et al. | 361/386 |
| 4,908,935 | 3/1990 | Blumenstock | 174/52.2 |
| 4,963,697 | 10/1990 | Peterson | 174/252 |
| 4,965,227 | 10/1990 | Chang | 437/207 |
| 5,003,429 | 3/1991 | Baker et al. | 361/386 |
| 5,014,161 | 5/1991 | Lee | 361/709 |
| 5,065,277 | 11/1991 | Davidson | 361/383 |
| 5,075,822 | 12/1991 | Bäumler et al. | 361/388 |
| 5,089,935 | 2/1992 | Ito | 361/703 |
| 5,103,375 | 4/1992 | Cottingham et al. | 361/386 |
| 5,107,404 | 4/1992 | Tam | 361/424 |
| 5,166,862 | 11/1992 | Durivage, III | 361/703 |
| 5,182,632 | 1/1993 | Bechtel | 257/713 |
| 5,257,049 | 10/1993 | Peteghem | 361/703 |

OTHER PUBLICATIONS

"Interface – – – Devices", Ecker, IBM Tech Discl Bull vol. 10 No. 7 Dec. 1967, p. 943.

*Primary Examiner*—Gerald P. Tolin
*Attorney, Agent, or Firm*—Roger L. May; Mark L. Mollon

[57] ABSTRACT

An electronic module containing a heat sink member, a flexible printed circuit board with electrical components mounted on both sides, and a protective cover. The heat sink member has an external surface containing a plurality of protruding fins. Its internal surface contains a raised grid of ribs with cavities present between the ribs. The cavities contain ceramic-filled silicone for improved heat transfer between the electrical components present on the circuit board, and the heat sink member. High heat-producing components are mounted on one side of the circuit board and are thermally coupled with the heat sink member by means of copper-plated through-holes in the circuit board. The protective cover is mounted to the internal surface of the heat sink and encloses the printed circuit board. A connector assembly serves to connect the electronic module to external circuitry.

15 Claims, 3 Drawing Sheets

5,548,481

ELECTRONIC MODULE CONTAINING AN INTERNALLY RIBBED, INTEGRAL HEAT SINK AND BONDED, FLEXIBLE PRINTED WIRING BOARD WITH TWO-SIDED COMPONENT POPULATION

This application is a continuation of Ser. No. 08/043,099, filed Apr. 5, 1993, now abandoned

BACKGROUND OF THE INVENTION

The present invention relates to an electronic module having a flexible printed circuit board, with two-sided component population, bonded to an internally ribbed, integral heat sink.

Electronic packages containing externally-finned heat sinks are well known, with recent examples being described and illustrated in U.S. Pat. Nos. 5,003,429 (Baker et al.) and 4,177,499 (Volkmann). Also well known are modules having a ribbed heat sink and a printed circuit board populated on both sides with electrical components, as described and illustrated in U.S. Pat. No. 4,837,664 (Rodriguez et al.). These patents do not disclose the advantages of a design comprising an internal rib structure, combined with external fins, which allows for improved heat dissipation over devices available previously.

Many devices on the market currently, however, lack the durability necessary to perform well in an underhood automotive environment. In addition, many modules contain surface-mounted power drivers in combination with externally-connected power drivers. Such an arrangement may require numerous types of assembly equipment and, as a result, may be difficult to manufacture. Further, externally-connected power drivers do not dissipate heat as well as surface-mounted power drivers—those mounted directly on a printed circuit board which, in turn, contacts a heat sink.

The aforementioned patent issued to Rodriguez et al. discloses dual grid partitions which may be constructed of thermally conductive material. These grid partitions are not in contact with a heat sink and require that a cover be mounted over each in order to protect the electrical components contained on a thermal plane sandwiched between the partitions. Additionally, the device is unable to accommodate thermally conductive material within the grid partition without leakage due to the open-ended cavities within the grid. The presence of thermally conductive material in proximity to electrical components aids in the dissipation of heat away from the components.

It is seen, therefore, that there is a need for design improvements, including greater resistance to stress and vibration, increased heat transferability, and improved ease of assembly and manufacture.

SUMMARY OF THE INVENTION

An electronic module according to the present invention which meets this need comprises a heat sink member whose first side contains a raised grid of ribs with cavities between the ribs and whose second side contains a plurality of protruding fins. Those skilled in the art will appreciate that heat sinks are typically used to draw heat away from adjacent devices or circuits, thus improving the reliability of such devices. Mounted to the heat sink is a flexible printed circuit board with electrical components mounted on both sides. The first side of the circuit board is in contact with the first side of the heat sink. A protective cover encloses the second side of the circuit board and is mounted on the first side of the heat sink member.

The printed circuit board is secured to the grid of ribs on the first side of the heat sink by means of an electrically insulative adhesive. The electrical components mounted on the first side of the circuit board are appropriately spaced to avoid contact with the ribs on the heat sink, thus allowing the electrically insulative adhesive to form a bond between the circuit board and the ribs. As a result, the electrical components mounted on the first side of the circuit board fit within the cavities between the ribs on the heat sink when the board and sink are secured together. The cavities, therefore, allow the circuit board to be populated with components on the surface that directly contacts the heat sink, as well as on the surface opposite that which contacts the heat sink. This double-sided population of the flexible printed circuit board enables the production of a package of reduced size.

The first side of the heat sink contains cavities between ribs, with each cavity having a closed end opposite its open end. The closed end of the ribs allows for improved heat transfer between the ribs on the first side of the heat sink and the protruding fins on the second side of the heat sink. In order to further improve heat transfer between the electrical components and the heat sink, the cavities between the ribs may contain a thermally conductive material therewithin. A tight seal between the printed circuit board and the grid of ribs allows for inclusion of the thermally conductive material within the cavities without danger of leakage. The preferred design contemplates the use of ceramic-filled silicone as the thermally conductive material within the cavities. One skilled in the art, however, will appreciate that any thermally conductive material may be used and that the use of ceramic-filled silicone should not be construed as a limitation upon the present invention. In addition, one skilled in the art will appreciate that the cavities may contain, alternatively, structural damping material in order to improve reliability in light of vibration or an encapsulating sealant for environmental protection.

Power drivers, which are high heat-producing components, are mounted on the second side of the printed circuit board. Preferably, the high heat-producing components are thermally coupled with the heat sink by means of a copper film in order to increase the rate of heat dissipation from the high heat-producing components.

Accordingly, it is an object of the present invention to provide an electronic module which is highly resistant to stress and vibration, has increased thermal conductivity between electrical components and the heat sink, and has improved ease of assembly and manufacture.

DETAILED DESCRIPTION OF THE PREFERRED EMBODIMENTS

Figure 1:
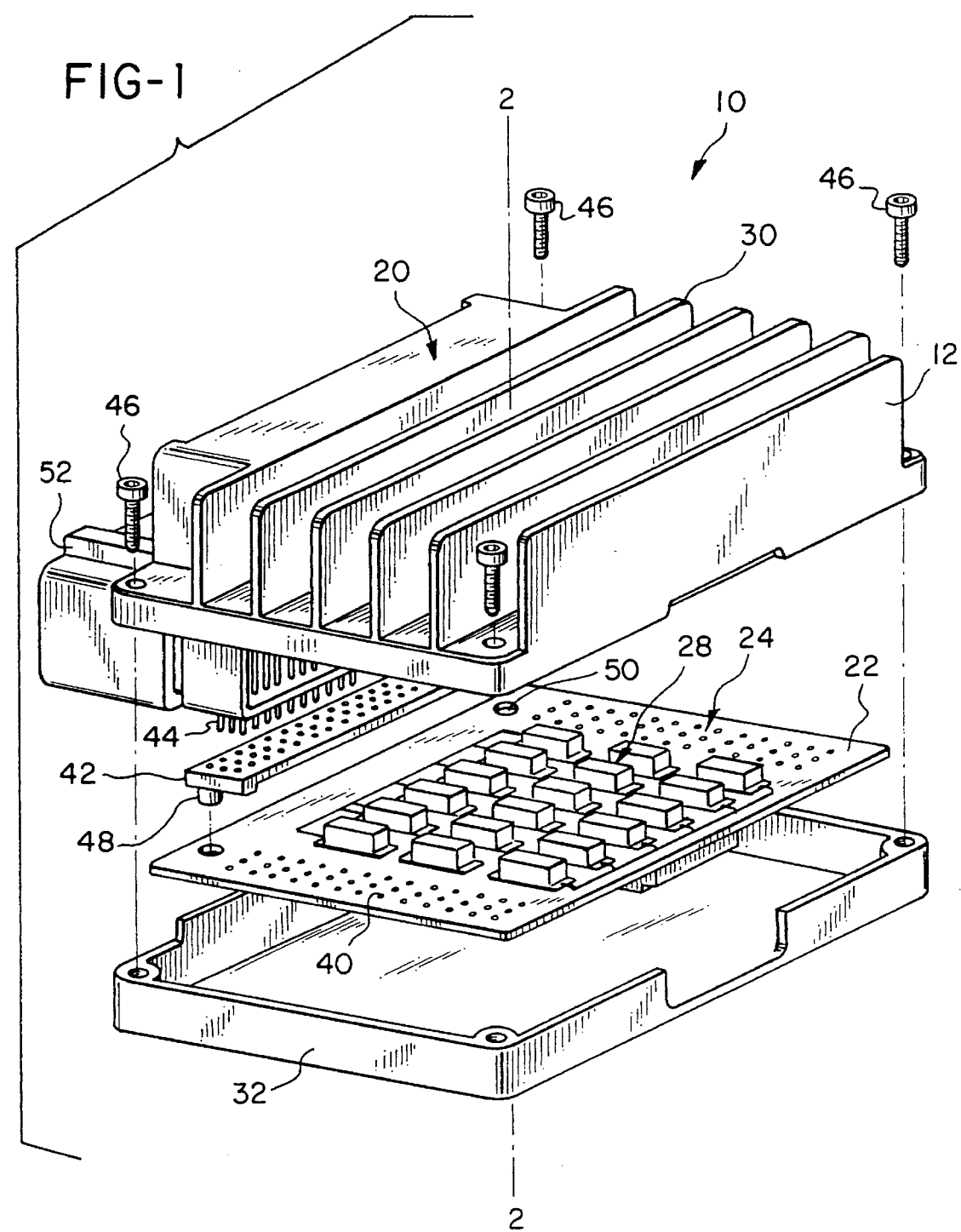
FIG. 1 is an exploded perspective view of the present invention, illustrating the protruding fins on the exterior surface of the heat sink, the flexible printed circuit board populated with electrical components, and the protective cover attached to the heat sink and enclosing the circuit board.
Figure 2:
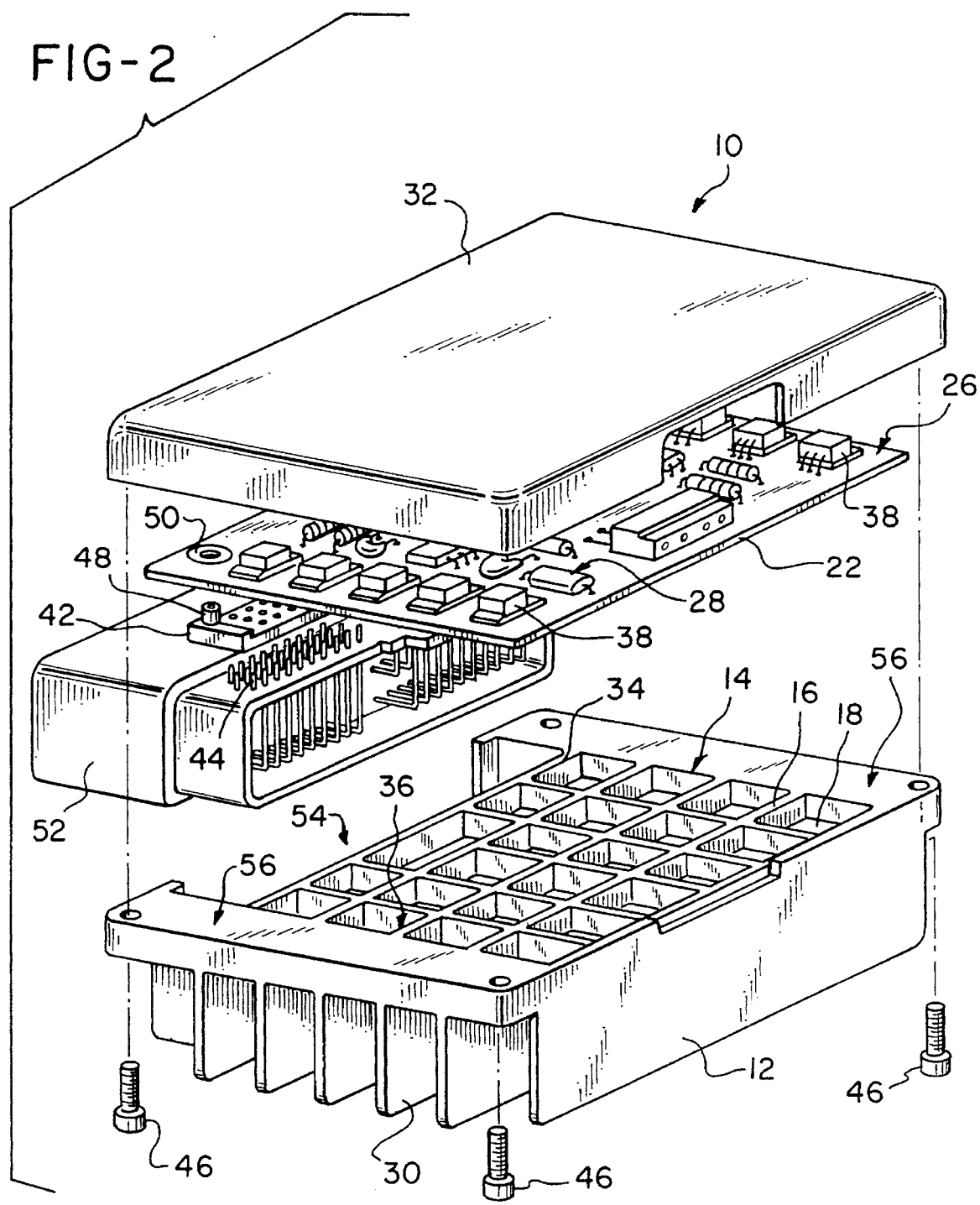
FIG. 2 is an exploded perspective view, similar to that of FIG. 1, but inverted, showing the raised grid of ribs on the internal surface of the heat sink, the cavities between the ribs, and the presence of electrical components on the reverse side of the circuit board.

Reference is made, collectively, to FIGS. 1 and 2, which depict an electronic module 10 comprising a heat sink member 12 with a first side 14 defining a raised grid of ribs 16 and a second side 20, opposite first side 14, defining a plurality of protruding fins 30. First side 14 further includes cavities 18 between ribs 16. A flexible printed circuit board 22, defining first side 24 and second side 26, is mounted to heat sink member 12 using an electrically insulative and thermally conductive adhesive 34, such that the first side 24 of circuit board 22 faces the first side 14 of heat sink member 12.

A plurality of electrical components 28 is mounted on first side 24 and second side 26 of circuit board 22. The double-sided population of circuit board 22 with electrical components 28 allows for placement of a large number of electrical components 28, thereby reducing package size. Electrical components 28 mounted on first side 24 are spaced appropriately to avoid contact with ribs 16 on heat sink 12. A protective cover 32 encloses second side 26 of circuit board 22 and is mounted to first side 14 of heat sink 12 by means of screws 46.

Cavities 18 are present between ribs 16 on first side 14 of heat sink 12. Ceramic-filled silicone 36 is included within cavities 18 in order to facilitate the transfer of heat between electrical components 28 and heat sink 12. It may be appreciated by one skilled in the art that thermally conductive materials other than ceramic-filled silicon 36 may be included within cavities 18 in order to aid in the transfer of heat from components 28 to heat sink 12. The use of cavities 18—i.e., blind holes—instead of through holes allows for the placement of thermally conductive material therebetween, thus increasing the device's ability to draw heat away from electrical components 28. The blind holes also obviate the need for a second cover, similar to protective cover 32, to protect first side 24 of printed circuit board 22. Cavities 18 may, alternatively, be filled with a high structural damping material to improve reliability in a high vibration environment, or with an encapsulating material for improved environmental protection.

Included along with electrical components 28 are high heat-producing components 38 mounted on second side 26 of circuit board 22. High heat-producing components 38 are thermally coupled with heat sink 12 by means of copper-plated through-holes 40. The reader will appreciate that high heat-producing components 38 are mounted on circuit board 22 such that they are in thermal contact, via copper-plated through-holes 40, with surfaces 56 on first side 14 of heat sink 12.

Figure 3:
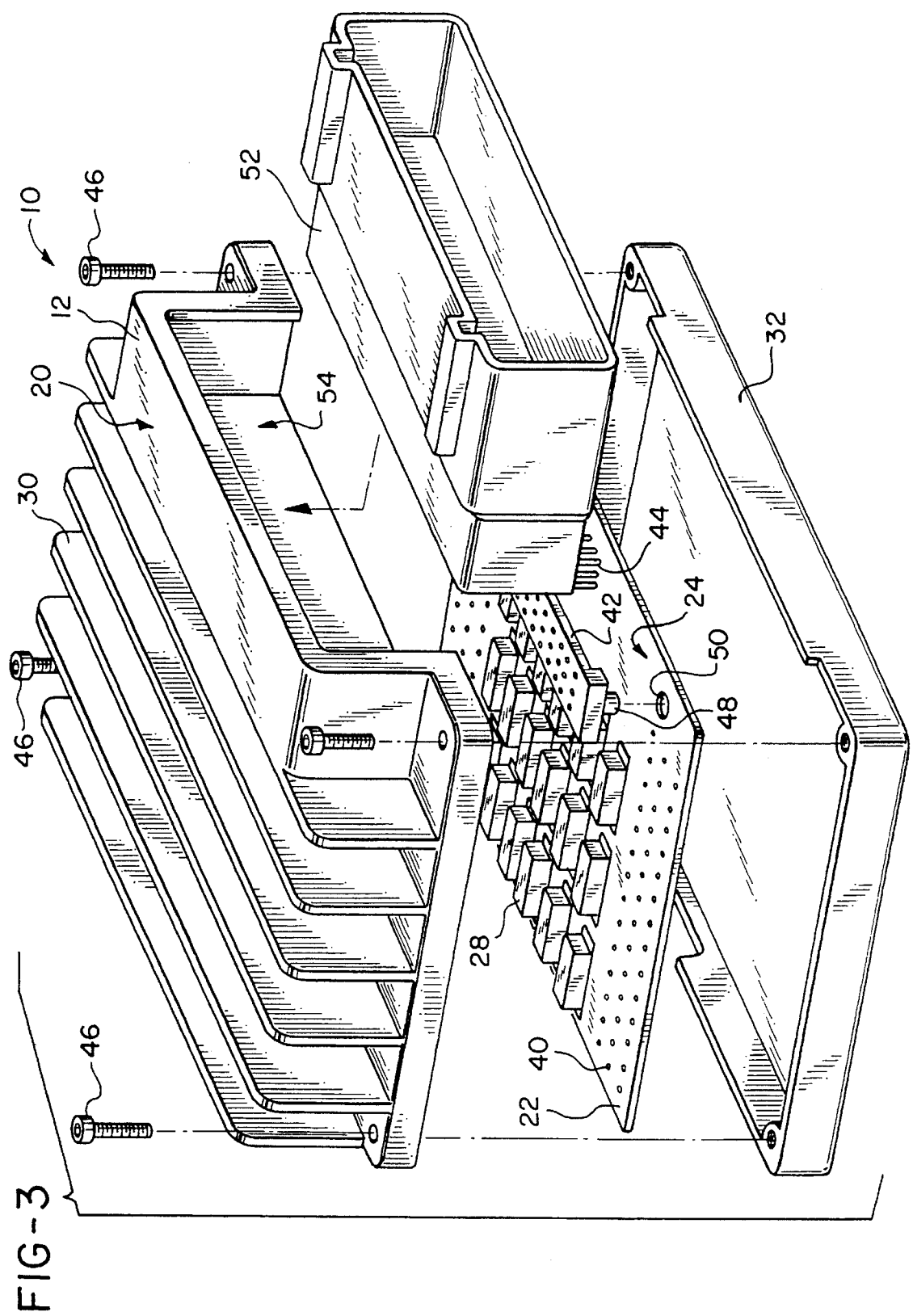
FIG. 3 is an exploded perspective view, similar to FIG. 1, but rotated 180 degrees about a vertical axis. It illustrates the positioning of the connector assembly within a recess in the heat sink.

Reference is now made to FIG. 3. Connector assembly 52 fits within recess 54 in heat sink 12 and allows for connection of electronic module 10 to external circuitry. Connector pins 44 protrude from connector assembly 52 and contact filter capacitor array 42. Filter capacitor array 42 is electrically connected to circuit board 22 by means of array pins 48, which are soldered to metallized holes 50. Metallized holes 50 are electrically coupled to electrical components 28.

During normal operation of the present invention, heat is produced by electrical components 28 and high heat-producing components 38. Without a method of removing this heat from around the components 28 and 38, these components will often cease to operate properly. Electronic module 10 provides a means whereby excess heat produced by electrical components 28 is drawn away from these components through electrically insulative and thermally conductive adhesive 34 and ceramic-filled silicone 36, to the ribs 16 on the first side 14 of heat sink member 12. Heat sink 12 is constructed of a material possessing high thermal conductivity, such as metal, thereby allowing the heat to pass from the ribs 16 to the opposing second side 20 of heat sink 12. From the second side 20, the heat is eliminated from the module 10 through the protruding fins 30.

A great deal of heat is produced by high heat-producing components 38. In order to eliminate this heat in a manner more rapid than that used to draw heat away from electrical components 28, the high heat-producing components are thermally coupled to heat sink 12 through the use of copper-plated through-holes 40. Through-holes 40 are located on printed circuit board 22, and contact heat sink 12 in order to provide a direct path of heat transfer between high heat-producing components 38 and surfaces 56 on first side 14 of heat sink 12. Again, protruding fins 30 allow for heat to be drawn away from heat sink 12.

Having described the invention in detail and by reference to the preferred embodiment thereof, it will be apparent that other modifications and variations are possible without departing from the scope of the invention defined in the appended claims.

What is claimed is:

1. An electronic module comprising:
   a heat sink member having a first side defining a grid of ribs with cavities between said ribs, and a second side, opposite said first side, defining a plurality of protruding fins;
   a flexible printed circuit board having a first side and an opposing second side, said circuit board being mounted on said heat sink member, with said first side of said circuit board facing said grid of ribs;
   a plurality of electrical components mounted to both sides of said printed circuit board, a majority portion of at least one of said electrical components, mounted to said first side of said printed circuit board, being enclosed inside of at least one of said cavities; and
   a protective cover enclosing the second side of said printed circuit board and mounted on said first side of said heat sink member.

2. An electronic module as claimed in claim 1, wherein said printed circuit board is secured to said grid of ribs by means of an electrically insulative adhesive.

3. An electronic module as claimed in claim 1, wherein said electrical components on said printed circuit board are appropriately spaced to avoid contact with said ribs on said first side of said heat sink member.

4. An electronic module as claimed in claim 1, wherein said cavities between said ribs contain thermally conductive material.

5. An electronic module as claimed in claim 4, wherein said thermally conductive material comprises ceramic-filled silicone.

6. An electronic module as claimed in claim 1, wherein said plurality of electrical components includes high heat-producing components mounted on said second side of said printed circuit board.

7. An electronic module as claimed in claim 6, wherein said high heat-producing components are thermally coupled with said heat sink member by means of copper-plated through-holes.

8. An electronic module comprising:
   a heat sink member having a first side defining a grid formed of a plurality of crisscrossing, substantially perpendicular ribs with blind-hole cavities between said ribs, and a second side, opposite said first side; and a flexible printed circuit board having a first side and an opposing second side, a plurality of electrical components being mounted to at least said first side, said circuit board being mounted on said heat sink member, with said first side of said circuit board facing said grid of ribs, and a majority portion of at least one of said electrical components, mounted to said first side of said printed circuit board, being enclosed inside of at least one of said cavities.

9. An electronic module as claimed in claim 8, further comprising a plurality of electrical components mounted on both sides of said printed circuit board.

10. An electronic module as claimed in claim 9, wherein each of said electrical components is appropriately spaced on the first side of said printed circuit board to avoid contact with said ribs on the first side of said heat sink member and is received within one of the cavities between said ribs.

11. An electronic module as claimed in claim 8, wherein said second side of said heat sink member defines a plurality of protruding fins.

12. An electronic module as claimed in claim 8, further comprising a protective cover enclosing the second side of said printed circuit board and mounted on said first side of said heat sink member.

13. An electronic module as claimed in claim 8, wherein said printed circuit board is secured to said grid of ribs by means of an electrically insulative adhesive.

14. An electronic module as claimed in claim 8, wherein said cavities between said ribs contain thermally conductive material.

15. An electronic module as claimed in claim 14, wherein said thermally conductive material comprises ceramic-filled silicone.

* * * * *